United States Patent [19]

Stow

[11] Patent Number: 4,568,602
[45] Date of Patent: Feb. 4, 1986

[54] SHEET MATERIAL ADAPTED TO PROVIDE LONG-LIVED STABLE ADHESIVE-BONDED ELECTRICAL CONNECTIONS

[75] Inventor: Robert H. Stow, Saint Paul, Minn.

[73] Assignee: Minnesota Mining and Manufacturing Company, Saint Paul, Minn.

[21] Appl. No.: 637,147

[22] Filed: Aug. 2, 1984

Related U.S. Application Data

[63] Continuation-in-part of Ser. No. 460,477, Jan. 24, 1983, abandoned.

[51] Int. Cl.$^4$ .............................................. B32B 3/00
[52] U.S. Cl. .................................. 428/172; 428/200; 428/206; 428/214; 428/343; 428/347; 428/349; 428/355
[58] Field of Search ............... 428/161, 164, 213, 201, 428/337, 349, 347, 355, 172, 148, 200, 206, 323, 328, 343, 40, 141, 156, 168, 173, 195, 209, 214, 346, 354, 356; 29/829; 427/208.6; 156/291, 295

[56] References Cited

U.S. PATENT DOCUMENTS

| | | | |
|---|---|---|---|
| 2,925,174 | 2/1960 | Stow | 428/346 |
| 2,964,587 | 12/1960 | Minot | 428/138 |
| 3,132,204 | 5/1964 | Giellerup | 174/117 A |
| 3,311,696 | 5/1967 | Melnick | 428/139 |
| 3,514,326 | 5/1970 | Stow | 428/328 |
| 3,762,946 | 10/1973 | Stow et al. | 428/344 |
| 3,778,306 | 12/1973 | Stow | 428/356 |
| 4,139,675 | 2/1979 | Nagai | 428/349 |
| 4,258,100 | 3/1981 | Fujitani et al. | 428/328 |
| 4,382,236 | 5/1983 | Suzuki | 428/209 |
| 4,414,052 | 11/1983 | Habata et al. | 156/273 |

*Primary Examiner*—George F. Lesmes
*Assistant Examiner*—William M. Atkinson
*Attorney, Agent, or Firm*—Donald M. Sell; James A. Smith; Gerald F. Chernivec

[57] ABSTRACT

Sheet material useful for making bonded electrical connections, especially to sets of small side-by-side terminal pads. In one typical form, the sheet material is an elongated tape comprising an elongated insulating backing; a plurality of narrow spaced parallel elongated electrically conductive stripes on the backing; and electrically conductive adhesive disposed over the stripes comprising a layer of adhesive material in which are contained a monolayer of electrically conductive elements which are thinner than the adhesive layer. The surface of the adhesive layer that contacts a substrate is configured so that at least a portion of the area of the surface is recessed below other areas of the surface, whereby when the adhesive layer is heated and pressed against a substrate, adhesive material may be displaced into the recessed areas and allow the electrically conductive elements to be brought into close electrical association with the substrate.

24 Claims, 2 Drawing Figures

SHEET MATERIAL ADAPTED TO PROVIDE LONG-LIVED STABLE ADHESIVE-BONDED ELECTRICAL CONNECTIONS

CROSS REFERENCE TO RELATED APPLICATIONS

This application is a continuation-in-part of application Ser. No. 460,477 filed Jan. 24, 1983 now abandoned.

BACKGROUND OF THE INVENTION

There is a need in the electronic equipment industry for means for making convenient and secure electrical connections to sets of small side-by-side terminal pads, such as the terminal pads of a printed circuit board or a liquid crystal display. A promising technique for making such connections is taught in laid-open United Kingdom patent application No. 2,048,582A, published on Dec. 10, 1980, which teaches an adhesive connector tape comprising a flexible insulative sheet, a plurality of parallel, separated, electrically conductive stripes carried on the sheet, and an electrically conductive adhesive covering the conductive stripes. Electrical connections can be made by adhering an end of the tape against a set of terminal pads, with individual stripes on the tape in alignment with individual pads.

For satisfactory use of sheet material as described, the electrically conductive adhesive in the sheet material must achieve a low-resistance bond that is stable for the length of time and under the operating conditions that are expected for the sheet material. Conventional coatings of electrically conductive adhesives in prior electrically conductive tapes, which for example use a metal foil backing, have not always provided the needed degree of stability and low resistance. Initial resistance is too high and/or resistance increases during use, to the extent that mechanical clamping techniques are often used to supplement the adhesive bond.

SUMMARY OF THE INVENTION

The present invention provides sheet material adapted to make adhesive-bonded electrical connections of improved stability and low resistance. Briefly, this new sheet material comprises an adhesive layer capable of softening to an adhesive condition upon heating to an elevated temperature, and subsequently hardening to exhibit a firm and substantially nonflowable condition at room temperature; and a monolayer of discrete separated electrically conductive elements contained within portions of the adhesive layer;

the adhesive layer being thicker than the elements in element-containing areas thereof and thinner than the elements in element-free areas thereof, such that the element-free areas are recessed below the element-containing areas whereby when the layer is heated and pressed against a substrate, adhesive material in the element-containing areas may be displaced into adjacent recesses in the element-free areas and allow the electrically conductive elements to be brought into close electrical association with the substrate.

The volume of the recesses is preferably equal to or greater than the volume of adjacent adhesive to be displaced and during bonding under pressure, the adhesive flows into the recesses discussed above.

Typically, sheet material of the invention takes the form of an elongated tape which is wound upon itself in roll form for convenience in storage and use. Also, a plurality of electrically conductive layers are typically included as narrow parallel elongated stripes carried on the backing under the adhesive layer, with the stripes laterally spaced from one another and extending the length of the backing. Connections are thus conveniently made between terminal substrates which comprise a plurality of separated side-by-side terminal pads. However, other configurations of conductive stripes or paths besides parallel stripes are used in some embodiments of sheet material of the invention for special applications.

The utility of sheet material of the invention contrasts with previous experience with commercial pressure-sensitive adhesive connector tape products of the type described in U.S. Pat. No. 3,475,213. Those tapes use a pressure-sensitive adhesive layer coated onto an electrically conductive backing, typically a metal foil, with a monolayer of relatively large particles contained within the adhesive layer. The particles in these tapes were substantially the same thickness as the adhesive layer and sometimes may have been more thick than the adhesive layer. However, these tapes do not always maintain low-resistance electrical connections unless clamps are used to hold the tape against a substrate. Apparently, the force holding the particles against the substrate gradually decreases after the tape has been adhered in place as a result of flow of the adhesive.

DETAILED DESCRIPTION

Figure 1:
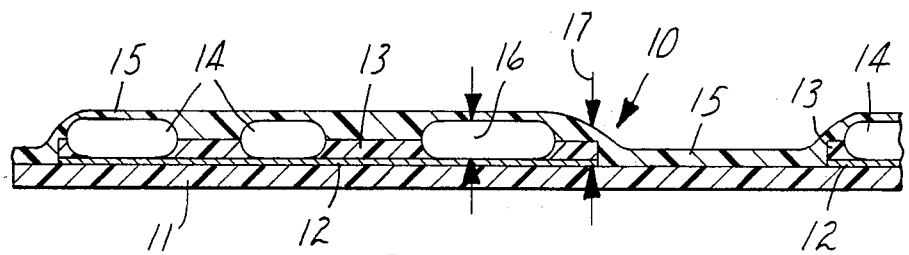
FIG. 1 is a sectional view through an illustrative electrical connector tape of the invention.

The illustrative tape 10 shown in FIG. 1 comprises a flat flexible electrically insulating sheet or backing 11, electrically conductive stripes 12, a layer of adhesive material 13 coated over the conductive stripes, electrically conductive particles 14 distributed in the adhesive layer, and a layer 15 of electrically insulating material coated over the whole top surface of the tape.

The flat electrically insulating sheet or backing 11 typically comprises a polymeric film, such as a film of polyethylene terephthalate or polyimide, or a resin-impregnated fibrous web. Preferred backings have a flexibility on the order of a 25- or 50-micrometer thick film of polyethylene terephthalate. However, less flexible backings can be used, generally by using greater pressure during a bonding operation and by using somewhat thicker adhesive layers.

The electrically conductive stripes 12 typically comprise a layer of metal, such as silver, gold, aluminum, or copper, vapor-deposited onto the flat backing. Other conductive layers can be used instead, such as metal foil, which may be adhered to the backing with adhesive, or a layer of metal sputtered onto the backing, or a layer formed from a conductive coating composition or ink, typically comprising a coating vehicle and conductors such as metal or carbon particles.

The adhesive material 13 is a heat-activated material which forms an adhesive bond during a heating operation. During the heating operation the adhesive material wets out a substrate to which adhesion is to be made. Subsequently, either by cooling or reaction of the ingredients, the adhesive hardens so that at room temperature the sheet material of the invention and conductive particles are held in place with respect to an adherend. At this point the adhesive material is either nontacky or poorly tacky.

One useful adhesive material, known as a "hot-tackifying adhesive," is nontacky or poorly tacky at 20° C., but becomes pressure-sensitive and aggressively tacky when heated. Good bonds are immediately formed at a tackifying temperature without any need for crosslinking or other chemical reactions. The adhesive material comprises an acrylic polymer or mixture of acrylic polymers of at least one alkyl acrylate and/or methacrylate ester monomer (here called "acrylic ester monomer"), and differs from prior art adhesive materials in that:

(1) acrylic ester monomer provides at least 50 mol percent of the one or more acrylic polymers of the adhesive layer, (2) said one or more acrylic polymers have a $T_g$ (glass transition temperature) or a weight-averaged $T_g$ of $-10°$ to 80° C., (3) a layer of the adhesive material has (a) a Probe Tack Value of less than 75 grams of force (gf) at 20° C., (b) Probe Tack Values of at least 75 gf over a range of at least 50° C., which values remain substantially constant after 30 days at 40° C., and (c) a Shear Value of at least 25 minutes at 65° C., and (4) up to 50 mol percent of the one or more acrylic polymers can be provided by copolymerizable monomer having a polar group, such as the amides of acrylic acid, methacrylic acid, itaconic acid and maleic acid, etc., acrylonitrile, methacrylonitrile, and N-vinyl-2-pyrrolidone.

For shear value determination a bright annealed stainless steel panel was heated in an oven for 15 minutes at 115° C. above the weight-averaged $T_g$ of the adhesive polymer. With the steel pannel horizontal, part of a tape 1.27 cm in width was adhered to the steel panel using a 2.04-kg hand roller which conformed to Federal Standard 147, with 2 passes in each direction. The tape which adhered to the panel was trimmed to a length exactly 1.27 cm in length and left at the bonding temperature for 15 more minutes. The plate was transferred to an oven having a shear stand which allowed a 2° backward tilt of the panel at its top (shear weight forced the tape toward the panel slightly). After 15 minutes at 65° C., a 1-kg weight was hung from the free end of the tape. The time at which the weight fell was the 65° C. Shear Value. The test is discontinued if no failure has been detected after a prolonged period, usually 110 or 1400 minutes.

The Probe Track Value is determined as described in ASTM D-2979 except in the following respects:

(1) To provide Probe Track Values at various test temperatures, the probe and the annular weight were heated to the test temperature, except that the annual weight was never heated above 220° C.

(2) The probe end was an annulus having inner and outer diameters of 3.83 and 5.10 mm.

(3) The annual weight was 19.8 g.

(4) Ten-second dwell.

The one or more acrylic polymers may be a homopolymer of an acrylic ester monomer which provides a $T_g$ within the range of $-10°$ to 80° C., e.g., methyl acrylate, or a copolymer of acrylic ester monomer and copolymerizable polar monomer having a $T_g$ within that range. Useful acrylic ester monomers which homopolymerize to a $T_g$ of at least $-10°$ include methyl acrylate, methyl methacrylate, ethyl methacrylate, propyl methacrylate, butyl methacrylates, bornyl acrylates, bornyl methacrylates, 2-phenoxyethyl acrylate, 2-phenoxyethyl methacrylate, the mono- and di-methyl and ethyl esters of itaconic acid, and the mono- and di-methyl and ethyl esters of maleic acid. Useful acrylic ester monomers which provide reduced $T_g$ include ethyl, butyl, and octyl acrylates, and n-amyl, hexyl and octyl methacrylates. A copolymer of 43 mol percent of methyl methacrylate, 53 mol percent of methyl acrylate and 4 mol percent of acrylamide had a $T_g$ of about 50° C. A copolymer of 73 mol percent of methyl methacrylate, 19 mol percent of methyl acrylate, 4 mol percent of ethyl acrylate, and 4 mol percent of acrylamide had a $T_g$ of about 79° C.

The described hot tackifying adhesive material becomes pressure-sensitive and aggressively tacky when heated, typically for use in this invention to a temperature of about 40° C. or above, and preferably 75° C. or above its $T_g$. When later subjected to temperatures at or even above the bonding temperature, adequate bonding strength may be retained. Electrically conductive particles may be dispersed into the adhesive material to form a conductive bond, and the particles and adherends tend to be retained in their bonded position by the firm adhesive material at elevated temperatures as well as room temperature.

Other copolymerizable monomers may also be employed in small amounts without detracting from the value of the acrylic copolymer for the purposes taught in the application. Among such copolymerizable monomers are styrene, vinyl acetate and vinyl chloride, which when used are preferably used in amounts up to about 5 mol percent of the total monomers.

Bonds exhibiting the best durability during prolonged exposure to high humidity (e.g., 95% RH) at elevated temperatures (e.g., 80° C.) are obtained with hot tackifying acrylic adhesives in which the acrylic polymer has an interacted functionally reactive organosilane coupling agent in an amount of at least 0.2 part per 100 parts by weight of total monomer. Best results are attained at about 0.5 to 4 percent.

The organosilane may be interpolymerized with the acrylic ester monomer, with or without other copolymerizable monomers, or it may be reacted with functional groups on the backbone of an acrylic polymer. Either process results in what is hereinafter called an "acrylic-siliane interpolymer."

The organosilane has the general formula $R_{(4-n)}SiX_n$, where X is a hydrolyzable group such as ethoxy, methoxy, or 2-methoxy-ethoxy; R is a monovalent organic radical of from 1 to 12 carbon atoms which contains a functional organic group such as mercapto, epoxy, acrylyl, methacrylyl, or amino; and n is an integer of from 1 to 3.

As is known in the art, the organosilane can cause solutions of polymers to gel, so that it may be desirable to employ an alcohol or other known stabilizers. When the organosilane is to be copolymerized with the other monomer, a stabilizer should be selected that does not interfere with the polymerization. Methanol is especially useful and is preferably employed in amounts from about twice to about four times the amount of the organosilane.

Other heat-activated adhesive materials that can be used are hot-melt adhesive materials, which are typically thermoplastic materials that soften to a flowable state and then cool to form an adhesive bond, and reactive compositions, such as epoxy-based adhesives. Such materials may flow more readily under pressure than the hot-tackifying adhesives and may be prefered for that reason. Sheet material in which the adhesive is pressure-sensitive at room temperature may also be used.

The conductive particles 14 in the illustrative sheet material of the invention shown in FIG. 1 are flattened to a generally common thickness. For example, a sieved batch of originally spherical particles may be passed through nip rolls such as in a paint mill; see U.S. Pat. No. 3,475,213. The flattened particles are especially desirable because they tend to lie on their flattened side, and a high percentage of the particles participate in conducting electrically through the adhesive layer in an adhesive bond. Spherical particles are also useful, especially when screened within narrow size ranges so that a high percentage of the particles are of about the same size. The particles should be sufficiently firm or rigid so as to penetrate through the adhesive layer 15 during a bonding operation, but some deformation of the particles may occur during the bonding operation, e.g., by pressure against a rigid substrate. The particles are usually metal, preferably silver but alternatively copper or aluminum (for which additives as described in U.S. Pat. No. 3,475,213 are desirable to achieve compatibility), or various other metals, metallized particles such as glass beads, carbon particles, etc.

The particles can range in thickness from at least 10 to 500 micrometers, though the preferred range for presently contemplated products is about 20 to 100 micrometers, and the adhesive layer can range in thickness from at least 25 to 550 micrometers, provided that the adhesive thickness is always greater than that of the electrically conductive elements in areas having such elements. (The average thickness of the adhesive layer is determined by measuring the approximate volume of adhesive material in the layer, and dividing that volume by the area of the sheet material.)

The electrically conductive elements are preferably substantially all separated on average by at least the average diameter of the elements, and more typically four or five times or more the average diameter, so as to allow the backing to conform around the elements during a bonding operation. On the other hand, the electrically conductive elements preferably occupy at least 2 percent, and more preferably at least 4 percent, of the area of the sheet material.

The layer 15 of electrically insulating material provides useful electrical insulation even though it should be thin, on the order of 10 micrometers in thickness over the conductive particles 14 in a construction as shown in FIG. 1. Resistances through the layer 15 to the conductive particles of at least one megohm should be achieved to obtain the desired insulation. Resistance is measured by laying a test sample over a one-centimeter-square copper substrate, with the exterior surface of the insulation layer of the sample against the substrate, and laying a 500-gram weight over the test sample at room temperature. Electrical connection has previously been made between a metal conductor and the conductive layer in the test sample, e.g., the stripes 12 in the sheet material shown in FIGS. 1 and 2, by heat and pressure. A voltage of 5 volts is applied to the metal conductor, with the copper substrate maintained at ground, and the resistance in the circuit measured.

The insulating layer 15 preferably comprises the same or a similar material as the adhesive material 13 in which the conductive particles 14 are contained. The previously mentioned hot-tackifying adhesive is presently a preferred material. One advantage is that it exhibits adhesive character over a wide temperature interval so that adhesive connections can be maintained even though the bond area has not cooled to room temperature. In some cases the insulating layer may comprise a different variety of hot-tackifying adhesive, such as a variety having a lower glass transition temperature ($T_g$) than the adhesive material in which conductive particles are dispersed. The higher-$T_g$ adhesive material offers greater firmness at room temperature, while the lower-$T_g$ insulating layer flows readily and assists in formation of a desired adhesive bond. Other adhesive materials such as hot-melt adhesives or reactive compositions may also be used.

Figure 2:
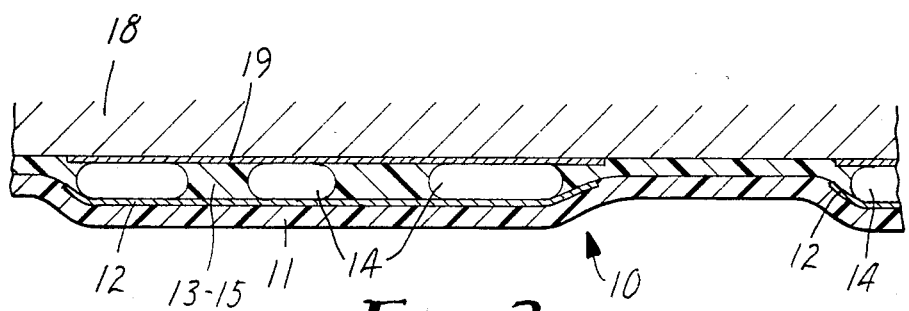
FIG. 2 is a sectional view showing the illustrative tape of FIG. 1 adhered to a substrate.

After bonding to a substrate, as shown for the substrate 18 carrying conductive pads 19 in FIG. 2, the contact surface of sheet material of the invention generally follows the surface of the substrate. (The adhesive layer 13 and insulating layer 15 are shown to have merged into one adhesive layer 13-15). The terminal substrates with which sheet material of the invention is used may be planar, with terminal pads embedded in the substrate and coplanar with the rest of the substrate, in which case sheet material of the invention forms a generally planar full-area contact with the substrate. Preferably, however, the terminal pads are slightly raised.

As discussed above, according to the present invention the adhesive layer in sheet material of the invention may be displaced from element-containing areas into adjacent recesses in element-free-areas. The area of the recessing need not be large in many cases, i.e., as little as 5 or 10 percent; but in other cases, as illustrated in the drawings, it is 50 percent or more though it is seldom more than about 75 percent.

As a result of the recessing, adhesive material in the area of the conductive stripes can be displaced during the bonding operation into the recessed areas between the stripes, and the electrically conductive elements become held in closer electrical association with the substrate. Such displacement occurs in proportion to the degree of flowability of the adhesive material and the degree of heat and pressure applied to the adhesive material during the bonding operation. A hot-tackifying adhesive material may not flow extensively during a bonding operation, and as shown in FIG. 2, the flexible backing conforms to the profiled thickness of the adhesive layer. Desirably the recessed areas of the adhesive layer are recessed at least 10 percent and preferably at least 25 percent, below the average height of the non-recessed area of the adhesive layer.

In the finished bond the electrically conductive elements occupy a sufficient proportion of the thickness of the adhesive bond to allow any necessary dielectric breakdown through the adhesive material to achieve conduction between the conductive stripe and a substrate to which the sheet material is adhered. Since the electrically conductive elements occupy a minor proportion of the area in the plane of a bond, they leave substantial area in which adhesive contacts the adherend.

Together, the adhesive material and electrically conductive elements provide an electrically conductive adhesive layer which is conductive through the layer but not laterally within the layer. Since the electrically conductive adhesive is not conductive laterally, the adjacent stripes remain electrically isolated from one another. The conductive particles in the electrically conductive adhesive make connection only through the adhesive layer from the electrically conductive stripe to a terminal pad with which the stripe is aligned.

Sheet material of the invention, especially when an elongated tape to be wound upon itself in roll form, preferably includes a low-adhesion backsize on the non-adhesive side, or a release liner disposed over the insulating layer. Also, primers may be applied to a polymeric or metallic backing to promote adhesion to an adhesive or insulating layer carried on the backing.

Sheet material of the invention is generally applied by aligning an end of the tape over the desired substrate to which connection is to be made, pressing the sheet material against the substrate, and at the same time heating the sheet material. Transfer adhesive sheet materials of the invention may be placed between desired adherends and a bonded electrical connection made by applying heat and pressure. In such transfer adhesive sheet materials electrically conductive elements may be dispersed in an adhesive material which forms a support web for the elements and an insulating layer may be disposed on one or both sides of the element-containing web. Also, the material in which the elements is dispersed may be a non-adhesive polymeric film, and adhesion be provided by the insulating layer. Similarly, the layer 13 in a product as shown in FIGS. 1 and 2 may be non-adhesive, e.g., because of reaction to a durable, firm state.

The invention will be further illustrated by the following example.

EXAMPLE TERPOLYMER A

An acrylic terpolymer was made by mixing together 10.4 parts of methyl methacrylate, 85.6 parts of methyl acrylate, 4.0 parts of acrylamide, 286 parts of ethyl acetate and 0.1 part of azo-bis-isobutylnitrile, purging the mixture with nitrogen to remove oxygen, and heating at 53°–55° C. for 16 hours to provide 98–99% conversion. The weight-averaged Tg of this polymer was 20° C.

TERPOLYMER B

Another acrylic terpolymer was made as in Polymer A, except that the monomer composition was 40 parts ethyl acrylate, 56 parts methyl acrylate, and 4 parts acrylamide. The weight-averaged Tg of this polymer was 0° C.

TAPE MANUFACTURE

Biaxially oriented polyethylene terephthalate film of 25 micrometers thickness, which had been heat-treated to develop superior thermal dimensional stability was used as a backing. Metallic silver stripes were applied by vapor deposition to one side, to a thickness of 25 nm and a width of 0.89 mm on 1.78 mm centers.

The hot-tackfying acrylic terpolymer A was mixed with flattened silver metal particles having diameters from 76 to 102 micrometers and thicknesses about 25 micrometers, the particles comprising about 8% by volume, based on the non-volatile terpolymer. The mixture was coated through a mask in stripes, on the silver-coated side of the film, in register with the vapor-deposited silver stripes. The dried terpolymer A in each adhesive stripe was about 13 micrometers thick after drying. Then the hot-tackifying acrylic terpolymer B was coated uniformly over the entire striped face, and dried to a thickness of about 13 micrometers. At the same time a low-adhesion backsize was applied to the other face of the tape. This tape was slit to widths of 2.54 cm, each tape having 14 pairs of silver metal stripes and silver particle-filled adhesive stripes. The tapes were wound upon themselves into rolls.

A piece of the tape 3.7 cm in length was applied to an unheated circuit board using a press, the moving platen of which was preheated to 170° C. Each of the stripes of the tape matched a corresponding conductive lead on the face of the circuit board (adhered length 0.6 cm). A pressure of 119 Kgf/cm$^2$ was applied for 5 seconds. The other end of the piece of tape was applied in the same way to an unheated indium-tin oxide coating on glass (adhered length 0.6 cm). After cooling to room temperature, the average resistance per channel was 237 ohms. After aging at 90° C. for 619 hours and cooling to room temperature, the average resistance per channel increased to 350 ohms. This rather modest increase in resistance suggests that good electrical conductivity should be retained after prolonged periods of use during which the adhesive may become rather warm due to electrical conduction and other phenomena.

The outer adhesive material, because of its lower Tg, enables adhesive bonding at lower temperatures than would an adhesive layer composed only of the inner adhesive material. However, the presence of the inner adhesive material enhances high-temperature performance.

What is claimed is:

1. Sheet material adapted to make bonded electrical connections to a substrate, the sheet material comprising:
   an adhesive layer capable of softening to an adhesive condition upon heating to an elevated temperature, and subsequently hardening to exhibit a firm and substantially nonflowable condition at room temperature; and
   a monolayer of discrete separated electrically conductive elements contained within portions of the adhesive layer;
   the adhesive layer being thicker than said elements in element-containing areas thereof and thinner than said elements in element-free areas thereof, such that said element-free areas are recessed below said element-containing areas, whereby when the layer is heated and pressed against said substrate, adhesive material in said element-containing areas may be displaced into adjacent recesses in said element-free areas and allow the electrically conductive elements to be brought into close electrical association with the substrate, the volume of said recess being equal to or greater than the volume of adjacent adhesive material to be displaced.

2. Sheet material of claim 1 in which the electrically conductive elements are separated on average by a distance equal to at least the average diameter of the elements.

3. Sheet material of claim 1 useful as a transfer adhesive and adapted to form bonds at both opposed surfaces of the adhesive layer.

4. Sheet material of claim 1 in which the adhesive layer is a hot-tackifying adhesive which exhibits a Probe Tack Value of at least 75 grams of force at a temperature of 40° C. or more.

5. Sheet material of claim 1 in which the adhesive layer comprises one or more acrylic polymers and (1) acrylic ester monomer provides at least 50 mol percent of the one or more acrylic polymers of the adhesive layer,
(2) said one or more acrylic polymers have a $T_g$ or a weight-averaged $T_g$ of $-10°$ to $80°$ C., and
(3) said adhesive layer has
 (a) a Probe Tack Value of less than 75 gf at 20° C.,
 (b) Probe Tack Values of at least 75 gf over a range of at least 50° C., which values remain substantially constant after 30 days at 40° C., and
 (c) a Shear Value of at least 25 minutes at 65° C.; and
 said adhesive layer adheres well to a clean substrate upon contact at any temperature within said 50° C. range.

6. Sheet material of claim 5 in which the adhesive layer comprises one or more acrylic copolymer of monomers, up to 50 mol % of which is at least one copolymerizable monomer selected from amides of acrylic acid, methacrylic acid, itaconic acid, or maleic acid, acrylonitrile, methacrylonitrile, and N-vinyl-2-pyrrolidone.

7. Sheet material of claim 5 in which the acrylic ester monomer is selected from alkyl acrylates having 1–8 carbon atoms in their alkyl groups, alkyl methacrylates having 1–8 carbon atoms in their alkyl groups, bornyl acrylates, bornyl methacrylates, 2-phenoxyethyl acrylate, 2-phenoxymethyl acrylate, the dimethyl and diethyl esters of itaconic acid, and the dimethyl and diethyl esters of maleic acid.

8. Sheet material of claim 5 in which at least one of styrene, vinyl acetate and vinyl chloride comprises up to 5 mol % of the total monomers.

9. Sheet material of claim 1 in which the adhesive layer comprises an acrylic-silane interpolymer of primarily acrylic ester monomer interacted with organosilane in an amount of at least 0.2 part per 100 parts by weight of total monomer, which interpolymer has a $T_g$ of $-10°$ to $80°$ C.

10. Sheet material of claim 9 in which the acrylic ester monomer is selected from alkyl acrylates and methacrylates having 1–8 carbon atoms in their alkyl groups; bornyl acrylates and methacrylates; 2-phenoxyethyl acrylate and methacrylate; the dimethyl and diethyl esters of itaconic acid and the dimethyl and diethyl esters of maleic acid.

11. Sheet material of claim 9 wherein the amount of organosilane is from 0.5 to 4 parts per 100 parts by weight of total monomer.

12. Sheet material of claim 9 in which the acrylic-silane interpolymer comprises monomers, up to 50 mol % of which is at least one copolymerizable monomer selected from the amides of acrylic acid, methacrylic acid, itaconic acid, or maleic acid, acrylonitrile, methacrylonitrile, and N-vinyl-2-pyrrolidone.

13. Sheet material of claim 12 in which styrene, vinyl acetate and vinyl chloride comprise up to 5 mol % of the total monomers.

14. Sheet material of claim 1 which includes a flexible backing on which the adhesive layer is carried.

15. Sheet material of claim 14 in which the backing is a polyester film of about 50 micrometers thickness or less.

16. Sheet material of claim 14 which includes an electrically conductive layer between the flexible backing and the adhesive layer.

17. Sheet material of claim 16 which includes a plurality of electrically conductive layers in the form of narrow parallel electrically conductive stripes.

18. Sheet material of claim 17 in which electrically conductive elements are disposed in the adhesive layer only over the electrically conductive stripes.

19. Sheet material adapted to make bonded electrical connections to a substrate, the sheet material comprising a flexible backing carrying narrow electrically conductive metal stripes thereon;
an adhesive layer carried on the backing over said stripes capable of softening to an adhesive condition upon heating to an elevated temperature, and subsequently hardening to exhibit a firm and substantially nonflowable condition at room temperature; and
a monolayer of discrete separated electrically conductive elements distributed in the adhesive layer and separated on average by a distance equal to at least the average diameter of the elements;
the adhesive layer being thicker than said elements in element-containing areas thereof overlying said stripes and thinner than said elements in element-free areas thereof between said stripes, such that said element-free areas are recessed below said element-containing areas, whereby when the layer is heated and pressed against said substrate, adhesive material in said element-containing areas may be displaced into adjacent recesses in said element-free areas and allow the electrically conductive elements to be brought into close electrical association with the substrate, the volume of said recess being equal to or greater than the volume of adjacent adhesive material to be displaced.

20. Sheet material of claim 19 in which the adhesive layer is a hot tackifying adhesive which exhibits a Probe Tack Value of at least 75 grams of force at a temperature of 40° C. or more.

21. Sheet material of claim 19 in which the adhesive layer comprises an acrylic-silane interpolymer of primarily acrylic ester monomer interacted with organosilane in an amount of at least 0.2 part per 100 parts by weight of total monomer, which interpolymer has a $T_g$ of $-10°$ to $80°$ C.

22. Sheet material of claim 19 in which the adhesive layer comprises one or more acrylic polymers and
(1) acrylic ester monomer provides at least 50 mol percent of the one or more acrylic polymers of the adhesive layer;
(2) said one or more acrylic polymers have a $T_g$ or a weight-averaged $T_g$ of $-10°$ to $80°$ C., and
(3) said adhesive layer has
 (a) a Probe Tack Value of less than 75 gf at 20° C.,
 (b) Probe Tack Values of at least 75 gf over a range of at least 50° C., which values remain substantially constant after 30 days at 40° C., and
 (c) A Shear Value of at least 25 minutes at 65° C.; and
 said adhesive layer adheres well to a clean substrate upon contact at any temperature within said 50° C. range.

23. Sheet material of claim 22 in which the adhesive layer comprises one or more acrylic copolymer of monomers, up to 50 mol % of which is at least one copolymerizable monomer selected from the amides of acrylic acid, methacrylic acid, itaconic acid, or maleic acid, acrylonitrile, methacrylonitrile, and N-vinyl-2-pyrrolidone.

24. Sheet material of claim 22 in which the acrylic ester monomer is selected from alkyl acrylates having 1–8 carbon atoms in their alkyl groups, alkyl methacrylates having 1–8 carbon atoms in their alkyl groups, bornyl acrylates, bornyl methacrylates, 2-phenoxyethyl acrylate, 2-phenoxymethyl acrylate, the dimethyl and diethyl esters of itaconic acid, and the dimethyl and diethyl esters of maleic acid.

* * * * *